United States Patent [19]
Costello

[11] Patent Number: 5,374,331
[45] Date of Patent: Dec. 20, 1994

[54] PREFLUX COATING METHOD

[75] Inventor: Bernard J. Costello, Princeton, N.J.

[73] Assignee: Argus International, Ringoes, N.J.

[21] Appl. No.: 34,520

[22] Filed: Mar. 19, 1993

Related U.S. Application Data

[62] Division of Ser. No. 781,116, Oct. 22, 1991, abandoned.

[51] Int. Cl.$^5$ ............................................. H05K 3/00
[52] U.S. Cl. .................................... 156/640; 156/651;
156/664; 156/901; 252/79.2; 427/96; 427/209;
427/348; 427/374.3; 427/385.5
[58] Field of Search ............ 156/901, 640, 665, 666,
156/664, 651; 134/3, 41; 427/96, 97, 209, 348,
374.3, 385.5; 252/79.2

[56] References Cited

U.S. PATENT DOCUMENTS

| | | | |
|---|---|---|---|
| 3,788,912 | 1/1974 | Frantzen et al. | 156/640 X |
| 3,924,794 | 12/1975 | Allen et al. | 427/349 X |
| 4,373,656 | 2/1983 | Parker, Jr. et al. | 427/327 X |
| 4,481,236 | 11/1984 | Forsterling | 427/97 |
| 4,895,099 | 1/1990 | D'Amato | 156/345 X |
| 5,180,465 | 1/1993 | Seki et al. | 156/901 X |

Primary Examiner—Thi Dang
Attorney, Agent, or Firm—Louis Weinstein

[57] ABSTRACT

Method for pretreatment of the metallic surfaces such as conductive patterns on printed wiring boards to protect against oxidation and/or other contamination. Boards are passed through successive stations to perform the following operations at least upon the metallic surfaces of the boards: remove oily substances; micro-etch the conductive surfaces; form a protective monolayer with a solution compatible with soldering materials; remove excess protective coating by rinsing; air dry and infrared dry the protective coating; uniformly supply a preflux solution and dry the boards including clearing the preflux solution from any holes or openings within the boards; cool the boards to ambient temperature. Each step in which a solution or liquid is applied, is preferably followed by a rinse operation. The application and rinse operations are preferably separated from one another by a buffer zone. With the exception of the drying stages, the boards are advanced through all of the other stages in the process by rotatable rollers prevented from experiencing translational motion. The preflux solution is applied by three sets of rollers pairs for precoating, flooding, and thereafter regulating the uniformity and thickness of the preflux layer.

17 Claims, 3 Drawing Sheets

PREFLUX COATING METHOD

This is a division of application Ser. No. 07/781,116, filed Oct. 22, 1991, now abandoned.

FIELD OF THE INVENTION

The present invention relates to method and apparatus for treating printed wiring boards and, more particularly, to a novel method and apparatus for pretreating and preflux coating of metallic surfaces such as printed wiring boards and the like for protection of the wiring pattern.

BACKGROUND OF THE INVENTION

Printed wiring boards have traditionally been coated with protective materials to preserve solderability between the time of manufacture and the final assembly and soldering operations. Such protection is extremely important for printed wiring boards employing copper wiring surfaces due to the affinity of untreated copper to oxidation. The protective materials employed must be compatible with the underlying copper and the flux and solder used in final soldering. Therefore, the most obvious and popular materials employed are solder and either rosin or resin. Suitable preflux coating compositions are described in copending patent application Ser. No. 718,004, filed Jun. 20, 1991, now U.S. Pat. No. 5,176,749 and assigned to the assignee of the present invention. The preflux coating compositions described therein and which are incorporated herein by reference thereto, encompass the resin-type coatings. The solder-type coatings are termed "solder levelled" or "hot aired levelled" and are, strictly speaking, a "pre-solder type of protection" for the underlying copper. The present invention is directed to method and apparatus for pretreating copper through the employment of preflux-type coating compositions.

BRIEF DESCRIPTION OF THE INVENTION

The specific and preferred application of the preflux coating methods and apparatus described herein is for treatment of copper surfaces provided on printed wiring boards.

The present invention is characterized by comprising a method and apparatus for pretreating printed wiring boards to protect the wiring surfaces during assembly, thereby assuring clean, uncontaminated, solderable surfaces.

The method and apparatus of the present invention is characterized by comprising a plurality of sequentially performed steps which provide printed wiring boards with a uniform, protective preflux layer.

Initially, the printed wiring boards are cleaned to remove oily contaminations or the like from the metallic (i.e. copper) surfaces. Thereafter, the boards are rinsed, the cleaning and rinsing steps preferably being separated by a buffer zone.

The cleaned and rinsed printed wiring boards are then microetched to remove a thin layer of copper to insure that clean virgin copper is exposed and is free of all oxides, sulfides and the like which may have accumulated during the normal course of manufacture. A sufficient thickness of the order of ten to fifteen microinches of the conductive surface is removed to assure that all of the potential contaminants, whose exact nature may not be known, are removed. The boards are then rinsed after passing through a buffer zone which separates the microetching and rinse chambers.

In order to assure maximum solderability of the cleaned copper, the printed wiring boards undergo an acid rinse to remove sulfates and the like. The boards are then passed through a rinsing chamber which is separated from the acid rinse by a buffer zone.

The printed wiring boards then undergo a "passivation" step in which a monolayer of organic material is applied to the clean, virgin copper to protect the surface from atmospheric attack. The protective coating is applied as quickly as is practical after completion of the acid rinse step to prevent oxidation of the highly active copper surface. The passivation solution forms a monolayer on the copper. The particular solution employed is preferably chosen with a view toward environmental concerns.

The monolayer is formed very quickly and all of the remaining organic material on the wet surface is redundant and is rinsed away with tap water provided in a spray rinse chamber separated from the passivation chamber by a suitable buffer zone.

Upon completion of the last-mentioned rinse cycle, "air knives" remove surface water from the printed wiring boards immediately upon their passage out of the rinse chamber. The "air knives" are preferably turbo-driven since a turbo method provides better control of air quality and is more power efficient. In addition, the "air knife" technique assures the necessary removal of water from holes provided within the printed wiring boards.

After leaving the turbodryer, the printed wiring boards undergo an infrared drying cycle to remove adsorbed water on the copper surfaces. A relatively short infrared drying cycle has been found to be sufficient to fully and adequately perform this method step.

A preflux is now applied to the printed wiring boards. It is important to apply the preflux such that all of the surfaces of the work piece are thoroughly wetted by the preflux material. Also, excess material must be removed in a controlled fashion to leave a thin, uniform coating on the metallic areas. Although the laminate areas also are coated during this step, the thickness in uniformity of the preflux material applied thereto, is of relatively minor concern so long as the amount of material remaining thereon does not interfere with subsequent operations.

The preflux application is performed utilizing a multi-roller system that is stable with time and usage. The multi-roller system consists of three stages of mutually opposed roller pairs, the rollers in said roller pairs rollingly engaging opposing surfaces of the printed wiring boards. The structure, texture, porosity and hardness of each individual roller is designed to allow the roller to carry and release sufficient preflux material to thoroughly wet the surface of the printed wiring board and to apply uniform coating thereto. Each of the rollers is preferably formed of a rigid core cylinder formed of a suitable material, such as, metal or plastic. A layer of foam encircles the core cylinder, the foam layer being formed of an elastic foam made of a suitable plastic or rubber-like material and having a controlled porosity enabling a controlled amount of preflux to be drawn into the foam where it is available to be squeezed out of the foam upon passage of a work piece.

The outer layer is preferably a knitted sock formed of cotton or a synthetic fiber which is stretched over the foam layer. The external surface of the sock is preferably provided with a loop pile or a sheared pile which mats down and forms a relatively uniform surface to control the smoothness of the liquid layer formed on the printed wiring board. A finely woven silk-like sock formed of a polyester material has also been found to be effective in providing the desired thorough wetting and uniform coating.

The roller pairs are arranged in three side-by-side vertical columns, namely, upstream, center, and downstream columns. The preflux fluid is delivered to the upper roller of the center column. A flood tray is positioned to collect overflow from the lower roller of the center column. A pair of idler rollers are provided to respectively rollingly engage the upper rollers of the center column and the upstream column and the center column and the downstream column causing fluid delivered to the upper roller of the middle column by the fluid supply to be picked up by both idler rollers and fed to the upper rollers of the upstream and downstream columns by calendering action. The texture of the idler rollers determines the rate at which preflux fluid is transferred. For example, the idler rollers may have smooth cylindrical surfaces formed of metal or plastic, or alternatively, may have a fabric or textured surface dependent upon the rate of fluid transfer desired.

The preflux material employed may be the material described in copending application Ser. No. 718,004, filed Jun. 20, 1991, and assigned to the assignee of the present invention. Other materials having suitable or similar characteristics may be used, such as, for example, ENTHONE RT02R-HF manufactured by Enthone Corp. The preferred preflux material exhibits the characteristics of protecting the copper surfaces from contamination during the various assembly stages which typically can include three or more heating phases experienced during soldering operations. The layer of preflux material is similar to a thin lacquer in physical properties and tends to collect preferentially at the edges of the traces and in the holes of the printed wiring board and, when dryed, may significantly reduce the diameter of holes in the printed wiring boards and, in the case of small holes, such holes may be closed completely by the preflux material. To avoid this problem, the boards are exposed to an "air knife" which is comprised of a blast of air exiting from a narrow slot-like orifice arranged transverse to the direction of the work piece travel and can be delivered from either above or below the work piece. As an alternative, the narrow slot may be replaced by a row of holes, closely spaced, creating individual nozzles to direct the air flow toward the board. The air flow is modulated so as to be sufficient to clear the holes in the board but not so strong so as to disturb the surface coating and its uniformity.

Upon completion of the "air knife" step, the preflux is dryed by driving off solvents whereby the remaining rosin is dryed so that it is tack-free at room temperature. The vaporized solvents are extracted from the infrared oven and exhausted to the atmosphere.

Upon completion of the drying operation which utilizes an infrared oven, the boards are reoriented from a horizontal orientation to a vertical orientation and are indexed across a region in which low velocity air, preferably directed upwardly, is caused to flow between the work pieces to cool them to room temperature whereupon the boards are collected for further processing.

All of the above steps are preferably performed in tandem. The apparatus is provided with a series of elongated rollers arrayed perpendicular to the direction of travel. The technique employed conveys the work pieces from one treatment stage to the next without causing the conveyor elements to travel through the machine thereby preventing the undesirable transfer of solutions from one treatment stage to the next.

Although the pre-clean steps are preferably performed on-line, these steps can also be performed off-line, or alternatively, may be omitted so long as care is taken to avoid organic contamination of the printed wiring boards.

However, the acid clean step should immediately follow the etching step and likewise, the passivation step should immediately follow the acid clean step to assure proper effectiveness. Although the drying step following the passivation step is preferred, the copper surface is relatively stable at this time and will not readily degrade under typical handling and atmospheric conditions. If desired, the passivated printed wiring boards may be placed upon a rack to dry or in a oven to accelerate drying.

The preflux application may follow the off-line drying of the printed wiring boards. Likewise, the printed wiring boards may be placed on a rack to dry after completion of the preflux application and "air knife" treatment.

Although the present invention is advantageous for use in treating printed wiring boards, any other metallic surfaces may be treated using the method and apparatus disclosed and claimed herein. In addition, the applicator assembly may be used in any applications where it is desired to apply a coating to a board or board-like member.

OBJECTS OF THE INVENTION

It is therefore one object of the present invention to provide a novel method and apparatus for pretreatment of printed wiring boards or metallic members to protect copper or other metallic surfaces from oxidation and/or contaminants and to insure the provision of a metallic surface of excellent solderability.

Still another object of the present invention is to provide a novel method and apparatus for pretreatment of printed wiring boards in which the metallic surfaces are: cleaned to remove oily-type contamination; micro-etched to expose raw virgin copper; acid cleaned to remove sulfates and the like; passivated to form an organic molecular bonding monolayer and treated with a preflux to protect the printed wiring board from contamination or oxidation during subsequent assembly stages wherein the printed wiring boards undergo several heating cycles.

Still another object of the present invention is to provide a novel method and apparatus for pretreating printed wiring boards and the like wherein apparatus is provided for application of a uniform controlled preflux layer thereto.

Still another object of the present invention is to provide novel apparatus for uniformly applying a preflux layer in which a plurality of roller pairs are utilized for application of the preflux, all of said rollers having a unique predetermined multi-layer structure capable of withdrawing and dispensing a controlled amount of preflux.

Still another object of the present invention is to provide a novel multi-roller assembly for uniformly applying a preflux to printed wiring board and including multiple pairs of application rollers and further including idler rollers for controlling the saturation of upstream and downstream rollers by transferring a preflux solution from an upper center roller to upper rollers of upstream and downstream roller pairs by calendering action.

BRIEF DESCRIPTION OF THE FIGURES

The present invention will become apparent when reading the accompanying description and drawings in which.

DETAILED DESCRIPTION OF THE INVENTION

Although the apparatus and method described below is advantageous for pretreating and protecting printed wiring boards, the apparatus and method may be used to treat and protect any boards or metallic members that will benefit therefrom.

Figure 1A:
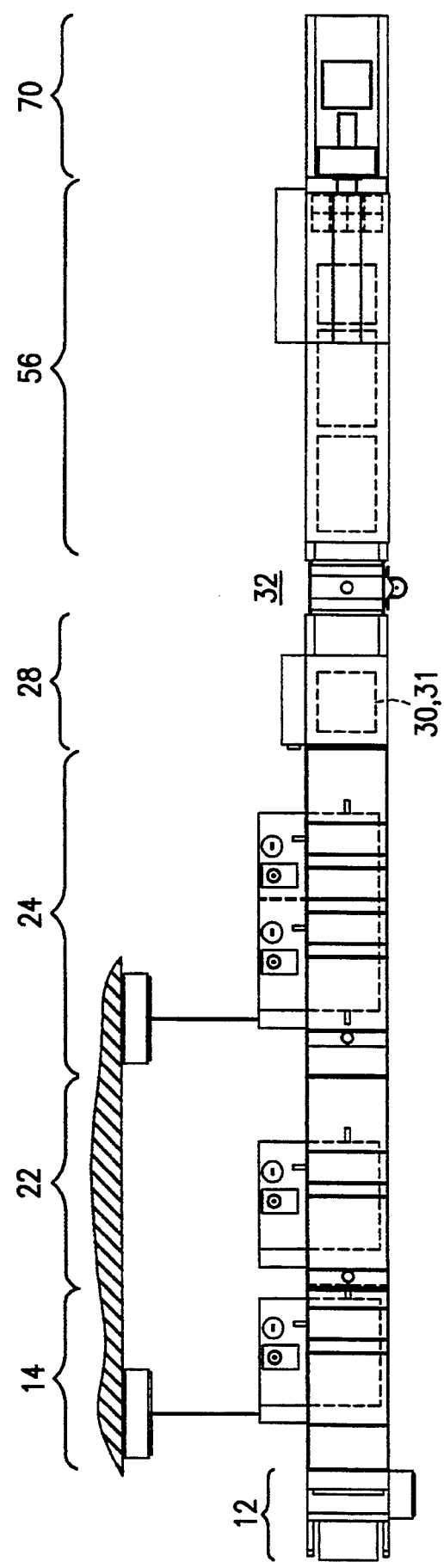
FIGS. 1a and 1b respectively show top and elevational views of apparatus for performing the novel method of the present invention.
Figure 1B:
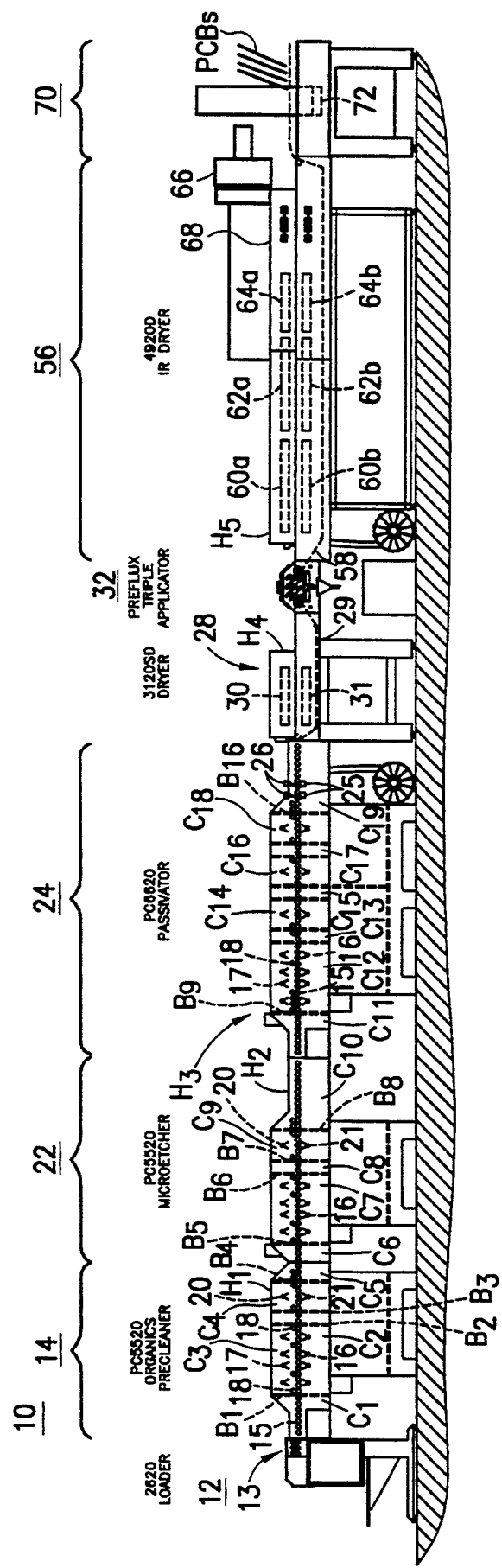

FIGS. 1a and 1b respectively show top and side elevational views of a system 10 designed in accordance with the principles of the present invention and to perform the novel method of the present invention, said system comprising a loader 12 for receiving printed wiring boards and introducing each of the printed wiring boards into the first treatment stage 14 which is comprised of a pre-cleaner. Loader 12 is provided with a plurality of roller pairs 13, each roller pair being comprised of an upper and lower roller cooperatively forming a nip into which a printed wiring board is introduced. The rollers are rotated by suitable drive means (not shown for purposes of simplicity) to advance the printed wiring board one at a time or, in equipment having sufficient width, two at a time arranged in side-by-side fashion.

The printed wiring boards enter into the pre-cleaner stage 14 to undergo an alkaline cleaning. The pre-cleaner stage 14 comprises a housing for enclosing the rotatable rollers and the spray means 16, 17. The printed wiring boards are conveyed horizontally from left to right through each step of the process, resting on the top surfaces of the rollers 15 and transported by the rolling action. At several intervals, upper rollers 18 are provided. The housing H1 of the pre-cleaner stage is divided into five compartments C1 through C5 which are defined by barrier walls B1 through B4. Barrier walls B1 and B2 define the wash chamber C2 separating the wash chamber from the upstream introductory chamber C1 and separating the wash chamber from a buffer chamber C3, the barrier walls having horizontally aligned slot-like openings of a dimension sufficient to permit free passage of the printed wiring boards while substantially retaining and confining the liquids sprayed therein to the respective chambers. Suitable collection means (not shown) is provided for collecting the solution sprayed upon the boards in wash chamber C2.

The printed wiring boards introduced into system 10 typically have some oily contamination on the copper surfaces. The contamination may be mineral oil or animal oil, such as fingerprints. The preferred method for removal of such materials is through the employment of a saponifier which enables the soil to be rinsed away with water.

The pre-cleaner comprises an alkaline cleaning machine whose components are preferably formed of a suitable plastic material. The series of elongated rollers, which are arrayed perpendicular to the direction of travel are constrained at their ends so as to experience rotation about their longitudinal axes while being prevented from any linear translation. The work pieces rest on the top surfaces of the rollers and are carried therethrough by rolling action. The printed wiring board advancing assembly is a well-known mechanism used throughout the industry and its advantage lies in the ability to convey work pieces therealong by conveyor elements which are prevented from moving throughout the system, thus, for example, preventing the undesirable transfer of liquids or contaminants from one stage of the system to the next.

An alkaline solution is sprayed under pressure from above and below the travelling work piece by the spray mechanisms 17 and 16 respectively.

The preferred composition of the solution is:

| | |
|---|---|
| Sodium Hydroxide | 7.5 lb. |
| Sodium Carbonate Monohydrate | 75.0 lb. |
| Trisodium Phosphate | 2.1 lb. |
| Sodium Gluconate | 9.1 lb. |
| Surfactant, Dowfax 3B2 | 4.3 lb. |
| Water | Remainder to make 100 gal. of solution. |

The relative proportions of each of the constituents in the composition may vary widely and still yield acceptable results.

The operation is performed at room temperature or up to 30° C.

The printed circuit boards travel through a buffer zone, chamber C3, in moving toward the rinse chamber C4, the buffer zone separating the alkaline chamber from the rinse chamber. The boards are rinsed with tap water which is pressure sprayed on the upper and lower surfaces of each work piece by suitable spray means 20, 21, arranged respectively above and below the printed wiring boards.

The barrier B4 separates the rinse chamber C4 from an outlet region or chamber C5 which separates the rinse chamber from the microetch stage 22. Stage 22 is comprised of barrier walls B5 through B8 which divide stage 22 into chambers C6 through C10, as shown. Stage 22 comprises a machine housing H2 which encloses the barrier walls B5 through B8, roller assemblies 15 and 18 which are similar to the roller assemblies 15 and 18 in stage 14, and the spray apparatus 16, 17, 20 and 21.

The printed wiring boards are conveyed through stage 22 in much the same manner as their conveyance through stage 14 and undergo treatment through stage 22 for the purpose of removing a thin layer of copper from all copper surfaces in order to insure that clean, virgin copper is exposed, free of all oxides, sulfides and the like which may have accumulated in the normal course of manufacture. Since the exact nature of potential contaminants is not fully known, it is deemed prudent to remove from ten to fifteen (10–15) microinches (millionths of an inch) of copper during the microetch stage. Allowance is made for this amount of copper loss in preceding processes including, of course, the initial formation of the copper surfaces upon the insulating substrate.

An acid solution for performing microetching is sprayed, under pressure, from above and below the moving work pieces by spray devices 17 and 16, respectively. The preferred composition of the solution is:

| | |
|---|---|
| Sulfuric Acid | 5 gal. |
| Sodium Persulfate | 34 lb. |
| Surfactant, Dowfax 3B2 | 2 lb. |
| Water | Sufficient to make 100 gal. of solution. |

The process control parameters should be targeted to this composition. In practice, the range may be such that each of the constituents may be ±15% those shown hereinabove. Wider variations are also feasible to suit the needs of the user. The copper etch rate is a function of the concentration of the composition as well as the time of exposure.

One typical example is such that for a removal of ten microinches, the printed wiring boards were exposed to the concentrations given above for a period of 25 seconds moving at a velocity of five feet/min.

After the microetch operation is completed, the work travels through the buffer zone, chamber C8, which separates the acid chamber C7 from the rinse chamber C9. The printed circuit boards entering the rinse chamber are sprayed by tap water under pressure from above and below the work piece to remove residual acid, whereupon the boards pass through barrier B8 along the conveyor rollers 15 to enter the stripper or acid rinse stage 24.

Stage 24 likewise is comprised of a housing H3 formed of a material resistant to the solutions provided therein such as, for example, plastic, and is divided into compartments C11 through C19 by barriers B9 through B16. A driver roller assembly comprised of rollers 15 and 18, similar to those used in stages 14 and 22 extend throughout stage 24. Stage 24 is utilized due to the fact that copper cleaning solutions of the type employed in stage 22 are known to leave small amounts of transparent sulfate (or similar) salts upon the copper surfaces. Such salts are detrimental to the objective of achieving maximum solderability of the cleaned copper. Hence stage 24 is utilized to apply a mild acid to the boards to remove the sulfate residue.

Similar roller conveyor elements 15 (and 18) introduce the boards into stage 24. The acid solution is sprayed under pressure from above and below the boards through suitable spray means 17 and 16 respectively. The preferred composition of the spray solution is:

| | |
|---|---|
| Hydrochloric Acid | 1.8 gal. |
| Fluoboric Acid | 0.2 gal. |
| Surfactant, Dowfax 3B2 | 0.5 lb. |
| Water | Sufficient to make 100 gal. of solution. |

The use of hydrochloric acid is preferred since it removes only salts of copper while having a minimal effect on the metallic copper. In addition, hydrochloric acid is easily rinsed away from the copper surface. Fluoboric acid is preferably added to stabilize the hydrochloric acid. The composition set forth may vary widely from the preferred values. For purposes of process control, the activity may be monitored according to the pH of the solution and make-up may be added in the proportions of the active acids. This may be accomplished through conventional means incorporating collection means typically provided at the floor of compartment C12, which collected solution is returned to the spray heads 16 and 17, with or without make-up solution in order to obtain the desired pH value.

The work then passes through a buffer zone, compartment C13, which separates the acid from the rinse water zone, compartment C14. The boards are rinsed in the rinse chamber under pressure sprays from above and below whereupon the boards then travel through a buffer zone, compartment C15, prior to entering into the passivation phase of the board pretreatment.

Although the treatment which the boards undergo in the passirate chamber is not truly a passivation process, the term is used as a convenience to describe the objective of applying a monolayer of organic material to the copper to protect the surface from atmospheric attack. It is extremely important to apply a protective coating to the copper surfaces as quickly as possible after the boards leave the acid rinse step in order to prevent oxidation of the highly active copper surface. To achieve this purpose, the acid rinse and the passivation step should be separated by no more than the minimum time and space required to perform the rinse step. In the apparatus described herein, the passivation step is separated from the acid rinse step by eighteen inches and the dwell time between these stages is preferably eighteen seconds. This can be reduced somewhat by modifications in the machine and/or the chemistry employed.

The preferred passivation chemistry is as follows:

| | |
|---|---|
| ENTHONE CU56 | 1.33 gal. |
| Surfactant, Dowfax 3B2 | 0.1 gal. |
| Water | Remainder to make 100 gal. of solution. |
| Buffer with Sodium Hydroxide to make pH = 8.0 to 8.5 | |

The composition may vary 50% either way for effective operation. For example, the CU56 may vary from 0.66 gal. to 2 gal. The 3B2 may vary from 0.05 gal. to 0.15 gal. The ENTHONE CU56 constituents is a Benzophonene-type material. It has been found that Benzotriozole is an effective alternative. I have also used potassium, ferricyanide in 1.0 to 2.5% concentrations and sodium dichromate in the range of 1.0 to 5% concentrations with good success. The "benzo" materials are preferred because of environmental concerns.

Since the above materials are molecular bonding materials, they form a monolayer on the copper very quickly. The remaining material on the wet surface is redundant and is rinsed away with tap water supplied by pressure outlets arranged above and below the boards in the rinse chamber C18, which is separated from the passivation chamber C16 by buffer chamber C17.

As soon as the boards exit from the rinse chamber C18, they immediately pass between "air knives" to remove surface water. The air knives are comprised of elongated conduits 25 and 26 arranged respectively below and above the path of movement of the boards and having a narrow slit to provide a "knife-like" flow of air. The air knives may be turbodriven or be supplied by compressed air. The turbo technique is preferred because air quality is more readily controlled and the turbo apparatus is more power efficient. Suitable turbo apparatus may comprise an air blower, means for powering and interconnecting ducts between the blower and the air knives. The "air knives" perform the particularly important function of removing water from holes and especially small holes in the printed wiring boards.

The boards, after leaving the turbodryer still have adsorbed water on the surface. The process of the present invention requires all water to be removed preparatory to preflux treatment. To accomplish this, the boards are passed from chamber C19 to infrared dryer 20 comprised of an infrared drying chamber which exposes the boards to a temperature of the order of 160° C. for approximately twenty seconds.

The infrared dryer utilizes open mesh, closed-loop conveyor belts 29 for conveying the boards through the dryer, which is further provided with upper and lower infrared heating assemblies 30, 31 for heating and drying both sides of the boards simultaneously.

When the boards are thoroughly dryed, they leave the drying chamber and thereby undergo some cooling after leaving the infrared drying chamber and before reaching the preflux applicator assembly 32.

The preflux must be applied so that all the surfaces of the work piece are thoroughly wetted by the preflux material. In addition, the excess material must be removed in a controlled fashion to leave a thin, uniform coating on the metallic areas. Although the laminate areas will likewise be coated, the thickness and uniformity of the coating on these surfaces are of relatively minor concern, as long as the amount of material remaining does not interfere with subsequent operations. It has been found that the industry typically requires 1.0 to 2.0 microns of coating upon the copper. Testing has shown that this requirement is easily satisfied using the method and apparatus of the present invention.

The preflux material must be applied controllably with a system that is stable with regard to both time and usage. The technique employed in the present invention comprises a three-stage roller system, i.e. triple applicator system 32 shown in FIGS. 1a and 1b. Each stage is comprised of mutually opposed rollers as shown in greater detail in FIG. 2a. Note, specifically, the upstream, middle and downstream pairs 34, 36 and 38 respectively of rollers each comprised of upper and lower rollers 34a, 34b, 36a, 36b, and 38a, 38b. It is critical that the structure, texture, porosity, and hardness of each individual roller in the applicator system be designed to allow each roller to both carry and release sufficient preflux material to wet the metallic surface thoroughly and in a uniform manner.

The upper rollers 34a, 36a and 38a are rotated by the rolling engagement with their associated rollers 34b, 36b and 38b, respectively, the rollers preferably being under at least slight compression sufficient to assure continuous rotation thereof, even the absence of a printed wiring board. In the presence of a printed wiring board, the roller foam layer undergoes significantly greater compression, as was described hereinabove.

The upper rollers 34a, 36a and 38a are adjustably mounted within suitably vertically aligned slots (not shown for purposes of simplicity) to regulate the squeezing pressure upon the boards and upon the engaging roller.

Figure 3:
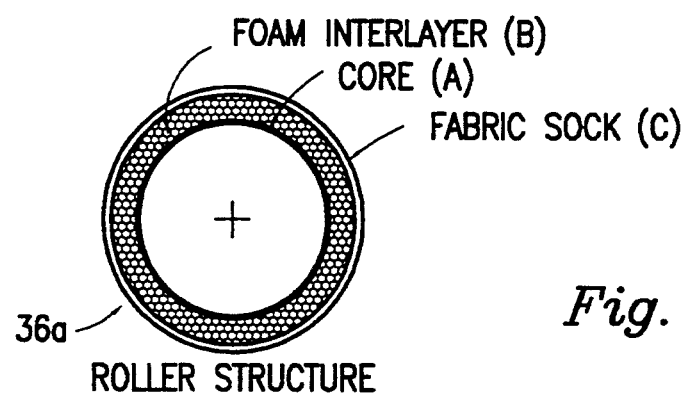
FIG. 3 shows the power train arrangement employed between the preflux applicator assembly shown in FIG. 2 and the adjacent upstream and downstream apparatus.

A preferred roller structure is shown in FIG. 3. Although FIG. 3 shows only one roller structure, namely, roller structure 36a, it should be understood that the remaining roller structures 34a through 38b are substantially identical in both design and function.

The roller structure 36a is comprised of a hollow cylindrical core A which is preferably a hollow tubular member formed of either a suitable metal or plastic. The primary function of the core A is to provide a stable and uniform platform to carry and support the outer layer or layers applied thereto and to provide a rigid backing which cooperates with outer layer(s) for releasing preflux material carried by the porous layer B (to be described in more detail hereinbelow) when a printed wiring board is squeezed between a pair of cooperating rollers.

Interlayer B is a layer of foam material having a controlled porosity. It has been found that the most effective material is elastic foam made of plastic or rubber-like material. The material utilized must not change in physical characteristics due to contact with the preflux. Polypropylene has been found very effective for this purpose. The porosity allows a controlled amount of preflux to be drawn into the porous foam where it is available to be squeezed out upon passage of the work piece.

Outer layer C is mounted upon interlayer B and is designed to provide a control surface to contact the work piece. When the composite structure of the roller is squeezed against the work piece, the preflux liquid is caused to be expelled from the structure on the first side of the nip to contact the work piece. This squeezing action causes the roller structure to release an amount of preflux material which is controlled by the combined properties of the structure.

As an alternative design, either layer B or layer C may be omitted.

As the work piece passes the nip N, the release of pressure from the roller structure causes the preflux material on the surface of the work piece to be partially recovered by this structure (much like a sponge).

In the preferred embodiment, it has been found that a knitted sock outer layer of cotton or synthetic fiber stretched over layer B effectively yields the desired application objectives. It is preferred that the exterior surface of the sock have a loop pile or a sheared pile which mats down and forms a relatively uniform surface to control the smoothness of the liquid preflux layer applied to the work piece.

It has also been found that finely woven silk-like socks made of a plastic material such as polyester have yielded the desired results. The smoothness of the sock surface may be controlled by the weave density.

Preflux fluid is delivered to the upper roller 36a of the pair of centrally located rollers 36 from an elongated trough 39 which delivers the preflux mixture to upper roller 36a by gravity. The trough is elongated and is substantially equal to or greater than the length of the rollers 34a–38b. Preflux liquid delivered to upper roller 36a flows by gravity to lower roller 36b when upper roller 36a is saturated. A small contoured pan 40 of a length somewhat greater than the length of roller 36b is positioned immediately beneath roller 36b, as shown to collect the overflow and provide a quantity of fluid for the lower roller to continuously contact, thus assuring that lower roller 36b is saturated to the maximum extent at all times.

The level of preflux liquid in pan 40 may be removed through conduit 40a to maintain a predetermined level within the pan. The liquid may either be drawn off to a collection container (not shown) or alternatively, may be filtered and returned to dispenser tray 39 by means of a suitable pump (not shown) for delivering make-up liquid through conduit 39a.

The upstream and downstream roller pairs 34 and 38 are maintained at controlled saturation by means of the idler rollers 42, 44 respectively rollingly engaging upper rollers 36a-34a and 36a 38a, as shown. Rollers 34a-36a further support idler roller 42 and rollers 36a-38a likewise support 30 idler roller 44. The upper surfaces of the rollers 34a, 36a, 38a rollingly engage the idler rollers as they are rotated such that fluid which is fed to roller 36a is picked up by the idler rollers 42 and 44 and is transferred to upper rollers 34a and 38a respectively by offsetting action. The texture of the idler rollers 42, 44 determines the rate of transfer of preflux fluid. Idler rollers 42, 44 may, for example, have smooth cylindrical surfaces, or alternatively, may have a textured surface with the nature of the surface being selected to obtain the desired transfer rate. Rollers 42 and 44 may be formed of any suitable metal or plastic material which is substantially unaffected by contact with the preflux material.

The preflux material applied to the printed wiring boards may, for example, be of the type described in copending application Ser. No. 718,004, filed Jun. 20, 1991, and assigned to the assignee of the present invention. The nature and the characteristics of the preflux material are set forth in detail in the aforementioned copending application which is incorporated herein by reference thereto. It is sufficient for the purposes of the present invention to understand that the characteristics of the preflux material are to provide a uniform protective coating to prevent oxidation and/or other contamination of the copper surfaces during subsequent assembly activity, including a number of heating cycles normally experienced by the printed wiring boards due to one or more processing operations, for example. If desired, other materials found to be effective, may be substituted for the preflux material described in the aforementioned copending patent application. One such material is ENTHONE RT02R-HF produced by Enthone Corp.

As was mentioned hereinabove, printed wiring boards move in the direction shown by arrow 45, passing through the upstream column, middle column and downstream column of roller pairs in consecutive fashion. The presence of the printed wiring board causes the rollers rollingly engaging the printed wiring board to be compressed thereby squeezing out preflux solution stored in the rollers. As was pointed out hereinabove, as the portion of the rollers which has been squeezed move away from the nip N, that portion resumes its original expanded condition which draws excess preflux fluid delivered to the printed wiring board surface back into the roller.

In operation, the first roller pair 34 coats the printed wiring board as it enters. The second roller pair 36 substantially floods both surfaces of the board to be sure that the board is fully coated. The third set of rollers 38 squeezes the board and controls the final amount of solution.

Figure 2:
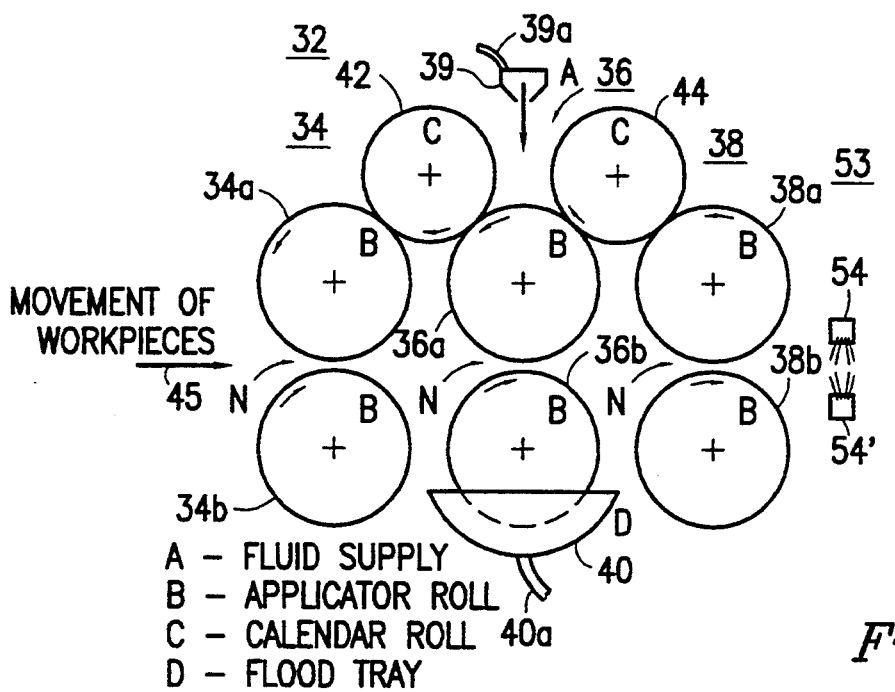
FIG. 2 shows an elevational view showing the preflux applicator employed in FIGS. 1a and 1b in greater detail.
Figure 2A:
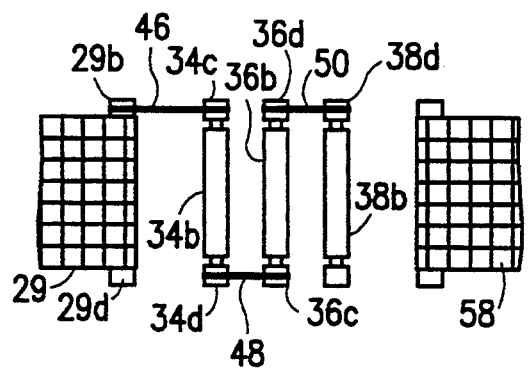
FIG. 2a is an end view showing a detailed and preferred structure of the rollers employed in the applicator assembly of FIG. 2.

FIG. 2a shows the manner in which the rollers of the applicator assembly are driven. The conveyor 29 of dryer 28 is provided with a downstream roller 29a having a pulley 29b which couples drive power to lower roller 34b through a pulley 34c by means of drive belt 46. A pulley 34d arranged at the opposite end of roller 34b couples power to lower roller 36b through drive belt 48 entrained about pulley 34b and a pulley 36c coupled to lower roller 36b. Lower roller 38b is rotated by means of a drive belt 50 entrained about pulleys 36d and 38c, as shown. In this manner, the movement of printed wiring boards through the applicator assembly is controlled by the speed of conveyor belt 29.

Although the applicator assembly 32 is extremely advantageous for use in applying preflux to printed wiring boards it should be understood that the applicator assembly may be used to great advantage in any application where it is desired to apply a controlled uniform coating to a board-like work piece.

The preflux material applied to the printed wiring boards exhibits the physical characteristics of a thin lacquer which tends to collect preferentially at the edges of the conductive traces and in the holes of the printed wiring board. Although the collection of the lacquer on the printed wiring board surfaces is no problem, the collection of lacquer within the holes in the board is disadvantageous, especially if the holes are completely closed by the wet preflux. When dryed, the hole diameter will be reduced and in the case of small holes, they may be closed completely. Since the holes must necessarily be free to receive connecting leads of electrical or electronic components, for example, it is important to prevent the reduction of hole size as well as the closure of the holes.

To achieve this result, an "air knife" is provided immediately adjacent the applicator assembly 32. The "air knife" constitutes a blast of air from a narrow orifice provided in an upper conduit 54, the blast of air being arrayed transverse to the direction of movement of the work piece. If desired, the "air knife" conduit may be arranged beneath the work piece as shown by the dotted assembly 54', as an alternative to arranging the conduit above the path of travel of the printed wiring boards.

The air flow from the "air knife" is modulated to be sufficient to clear the holes of preflux liquid but not so strong as to disturb the uniformity of the coating on the surfaces of the printed wiring boards.

Alternatively, a vacuum knife may be used to clean the holes by drawing away excess fluid from the holes.

The preflux, after application, is dryed by driving off solvents contained within the solution. The solid film remaining on the board is required to be dry and tack-free at room temperature. To accomplish this, the printed wiring boards are delivered to an infrared drying stage 56 incorporating an open-mesh conveyor belt 58 of the type described, for example, in U.S. Pat. No. 3,744,447. Infrared heaters 60a-60b, 62a-62b and 64a-64b are arranged above and below the open-mesh conveyor belt and utilize surface irradiators which emit long wavelength infrared energy, 98% of which energy preferably lies in the wavelength of from one to six microns. The temperature of the irradiators is controlled by sensing the infrared energy in the region between the heaters and controlling the power delivered thereto to maintain a constant drying condition for the work pieces.

Solvent vapors are extracted from the infrared oven housing H5 by blower means 66 which draw the solvents out through hood 68 and into a suitable conduit (not shown for purposes of simplicity) for introducing the solvent vapors into the atmosphere (after suitable treatment when necessary with a view toward environmental concerns).

As the printed wiring boards leave the drying stage 56, each work piece is hot and the rosin preflux, being thermoplastic, is soft and sticky. An unloading stage 70 comprised of a wicket-type conveyor intercepts each board as it leaves the conveyor and turns each board to an approximately vertical orientation, as shown. The boards are progressively collected in this manner and indexed across the cooling region wherein low velocity air from a suitable blower 72 moves upwardly between the work pieces causing them to cool to room temperature.

Upon cooling to room temperature, the preflux coating process is completed and the boards are collected for further processing. The cooling stage is designed to assure that the boards are sufficiently cooled by the time they exit from the downstream end of the cooling zone to be removed and collected for subsequent processing.

It can be seen from the foregoing, that the present invention provides a novel in-line system for pretreating printed wiring boards which assures relatively simple and yet high-speed handling and treatment of the boards to provide clean, virgin copper surfaces which are protected by a suitable preflux against oxidation and/or other contamination thereby providing boards having copper surfaces of excellent solderability even in applications where the boards undergo several heating cycles during assembly of components thereon. As is pointed out in copending application Ser. No. 718,004, filed Jun. 20, 1991, the nature of the preflux coating utilized is extremely advantageous for use due to its high flashpoint, ease of removal when the printed wiring board assembly steps are completed and its ease of application as well as the ability of completely protecting the coated surfaces against oxidation and/or other contamination.

A latitude of modification, change and substitution is intended in the foregoing disclosure, and in some instances, some features of the invention will be employed without a corresponding use of other features. Accordingly, it is appropriate that the appended claims be construed broadly and in a manner consistent with the spirit and scope of the invention herein described.

What is claimed is:

1. A method for treating printed wiring boards and the like comprising the steps of:

advancing printed wiring boards by means of rotating rollers along a treatment path;

initially cleaning the conductive patterns on the printed wiring board with an alkaline solution as the boards pass a pre-cleaned location;

rinsing the pre-cleaned boards as they are moved from the pre-cleaned location to a first rinse station by applying water under pressure to both major surfaces of the board as they pass along said path of travel and through the first rinse station;

treating the printed wiring boards with an acid solution for etching away a small predetermined surface portion of the conductive patterns on the board by spraying the acid solution upon both major surfaces of the printed wiring boards as they pass through a microetch stage;

rinsing the boards as they leave the microetch stage and enter a second rinse station by directing water under pressure upon both major surfaces of the printed wiring boards;

applying an acid rinse to both major surfaces of the printed wiring boards at an acid rinse stage by spraying an acid selected to remove deposits which may be left upon the surfaces of the metallic patterns by the previous treatment stages;

rinsing the printed wiring boards as they are advanced from the acid rinse stage to a third rinse station by applying water under pressure against both major surfaces of the printed wiring board;

applying a solution for forming a monolayer of organic material to protect the metallic surfaces from atmospheric attack, said material forming a molecular bond on the metallic surface;

rinsing away excess protective coating applied to the printed wiring boards as the printed wiring boards pass from said first protective coating stage to a fourth rinse station for rinsing both major surfaces of the printed wiring boards;

air drying at a first air knife stage the printed wiring boards as they leave the fourth rinse station by application of air under pressure at a turbodry stage to remove surface water and remove water from small holes in the printed circuit boards;

completely drying the printed circuit boards as they leave the turbodry stage by infrared radiation means to remove substantially all of the water from the printed wiring boards;

applying, at a preflux applicator stage, a preflux coating layer of uniform thickness to both major surfaces of the printed wiring board to protect the metallic surfaces from oxidation and/or other contamination including subsequent heating cycles employed for soldering or other application during subsequent assembly steps;

subjecting, at a second air knife stage, the printed wiring boards leaving the preflux applicator stage to air delivered at a pressure sufficient to remove preflux coating from any holes or openings within the printed wiring board without disturbing the integrity of the preflux coating applied to the surfaces of the board;

drying the boards as they leave the second air knife stage by exposing the major surfaces of the board to infrared energy for driving off solvents contained in the preflux solution; and cooling the printed wiring boards as they leave the infrared drying stage.

2. The method of claim 1 further comprising providing buffer stages between adjacent liquid application stages.

3. The method of claim 1 wherein the distance between the microetch stage and the immediately previous rinse station is sufficiently short so that the printed wiring boards move from said last-mentioned rinse stage to the microetch stage in a predetermined short interval of time.

4. The method of claim 3 wherein said interval of time is less than one minute.

5. The method of claim 3 wherein said interval of time is preferably less than one-half minute.

6. The method of claim 4 wherein the time interval is most preferably of the order of about eighteen seconds.

7. The method of claim 1 wherein the alkaline cleaning step utilizes an alkaline solution comprised of:

| | |
|---|---|
| Sodium Hydroxide | 7.5 lb. |
| Sodium Carbonate Monohydrate | 75.0 lb. |
| Trisodium Phosphate | 2.1 lb. |
| Sodium Gluconate | 9.1 lb. |
| Surfactant | 4.3 lb. |
| Water | Remainder to make 100 gal. of solution. |

8. The method of claim 1 wherein the microetch stage employs a solution comprised of:

| | |
|---|---|
| Sulfuric Acid | 5 gal. |
| Sodium Persulfate | 34 lb. |
| Surfactant | 2 lb. |
| Water | Sufficient to make 100 gal. of solution. |

9. The method of claim 1 wherein the acid rinse stage employs a composition comprised of:

| | |
|---|---|
| Hydrochloric Acid | 1.8 gal. |
| Fluoboric Acid | 0.2 gal. |
| Surfactant | 0.5 lb. |
| Water | Sufficient to make 100 gal. of solution. |

10. The method of claim 1 wherein the first application stage employs a composition comprised of:

| | |
|---|---|
| Benzotriazole | 1.33 gal. |
| Surfactant | 0.1 gal. |
| Water | Remainder to make 100 gal. of solution. |
| Buffer with Sodium Hydroxide to make pH = 8.0 to 8.5. | |

11. The method of claim 1 wherein the step of applying a preflux coating layer employs a composition comprised of a rosin solution containing toluene, methanol and ethyl acetate.

12. The method of claim 1 wherein the step of applying a preflux coating layer employs a composition comprised of non-toxic resin.

13. The method of claim 1 wherein the step of providing a preflux coating layer is further comprised of the steps of:
   initially wetting the printed wiring boards with preflux solution;
   thereafter flooding the printed wiring boards with preflux solution to assure that the conductive patterns are adequately covered with the preflux solution; and
   thereafter regulating the layer of the preflux solution applied to the printed wiring boards and removing excess preflux solution.

14. The method of claim 1 wherein the printed wiring boards are advanced in each spraying stage by a plurality of rollers arranged to support and rollingly engage the printed wiring board and rotating said rollers to advance printed wiring boards placed upon said rollers.

15. A method for treating conductive printed wiring patterns which have been formed on printed wiring boards comprising the steps of:
   advancing said printed wiring boards by means of rotating rollers along a treatment path;
   treating the printed wiring boards with an acid solution for etching away a small predetermined surface portion of the printed wiring patterns on the boards by spraying the acid solution upon both major surfaces of the printed wiring boards as they pass through a microetch stage;
   rinsing the boards as they leave the microetch stage and enter a first rinse station by directing water under pressure upon both major surfaces of the printed wiring boards;
   applying an acid rinse to both major surfaces of the printed wiring boards at an acid rinse stage by spraying an acid selected to remove deposits which may be left upon the surfaces of the printed wiring patterns by the previous treatment stages;
   rinsing the printed wiring boards as they are advanced from the acid rinse stage to a second rinse station by applying water under pressure against both major surfaces of the printed wiring boards; and
   applying, at a first protective coating stage, a solution for forming a monolayer of organic material to protect metallic surfaces from atmospheric attack, said material forming a molecular bond on the metallic surfaces;
   rinsing away excess protective coating applied during said first protective stage; and
   applying a composition of a non-toxic resin as a preflux coating layer of uniform thickness to both major surfaces of the printed wiring boards to protect the metallic surfaces from oxidation and/or other contamination due to subsequent heating cycles employed for soldering or other application during subsequent assembly steps.

16. The method of claim 15 further comprising the steps of:
   subjecting the printed wiring boards having a preflux coating layer to air delivered at a pressure sufficient to remove any preflux coating from any holes or openings within the printed wiring boards without disturbing the integrity of the preflux coating layer applied to the surfaces of the boards and;
   thereafter drying the boards by exposing the major surfaces of the boards to infrared energy for driving off solvents contained in the preflux coating layer.

17. The method of claim 16 further comprising the step of:
   cooling the printed wiring boards after they are exposed to infrared energy.

* * * * *